United States Patent
Higashi et al.

(10) Patent No.: US 6,467,670 B2
(45) Date of Patent: Oct. 22, 2002

(54) METHOD AND APPARATUS FOR MOUNTING COMPONENT

(75) Inventors: Kazushi Higashi, Neyagawa (JP); Hiroyuki Otani, Ikoma (JP); Shozo Minamitani, Ibaraki (JP); Shinji Kanayama, Kashihara (JP); Kenji Takahashi, Suita (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 9 days.

(21) Appl. No.: 09/756,307

(22) Filed: Jan. 8, 2001

(65) Prior Publication Data

US 2001/0001469 A1 May 24, 2001

Related U.S. Application Data

(62) Division of application No. 09/373,957, filed on Aug. 13, 1999, now Pat. No. 6,193,136.

(30) Foreign Application Priority Data

Aug. 20, 1998 (JP) .............................. 10-233875

(51) Int. Cl.⁷ ................................ B23K 20/12
(52) U.S. Cl. ....................... 228/1.1; 228/2.1; 228/8; 228/49.5; 156/356; 156/379; 156/580.1
(58) Field of Search .................. 228/1.1, 106, 110.1, 228/112.1, 113, 49.1, 114, 49.5, 114.5, 115, 2.1, 2.3, 5.5, 175, 8; 156/580.1, 73.1, 379, 73.5, 356

(56) References Cited

U.S. PATENT DOCUMENTS

| | | | |
|---|---|---|---|
| 3,738,560 A | * | 6/1973 | Kulicke, Jr. et al. |
| 4,157,932 A | | 6/1979 | Hirata |
| 4,881,997 A | * | 11/1989 | Hatch |
| 5,144,747 A | * | 9/1992 | Eichelberger |
| 5,681,757 A | * | 10/1997 | Hayes |
| 5,786,271 A | | 7/1998 | Ohida et al. |
| 5,969,461 A | | 10/1999 | Anderson et al. |
| 6,051,093 A | | 4/2000 | Tsukahara |
| 6,153,034 A | * | 11/2000 | Lipsker |
| 6,193,136 B1 | * | 2/2001 | Higashi et al. |
| 6,220,503 B1 | * | 4/2001 | Cox et al. |
| 6,299,051 B1 | * | 10/2001 | Tsujino |
| 6,311,888 B1 | * | 11/2001 | Funada et al. |

FOREIGN PATENT DOCUMENTS

| | | |
|---|---|---|
| JP | 11288975 | 10/1999 |
| WO | 9747031 | 12/1997 |

OTHER PUBLICATIONS

WO 86/03163 Provost et al. (Jun. 5, 1986).*
US 2001/0001469A1 Higashi et al. (May 24, 2001).*

* cited by examiner

Primary Examiner—M. Alexandra Elve
Assistant Examiner—Kiley Stoner
(74) Attorney, Agent, or Firm—Price and Gess

(57) ABSTRACT

Sealant 11 is supplied in advance to one or both of the electrical bonding areas 5,6 of the component 3 and the mounting surface 4, and as the component 3 is brought in contact with the mounting surface 4, the sealant 11 is compressed and filled therebetween in a required area. At the same time ultrasonic vibration is applied to the component 3 for generating friction between the electrical bonding areas 5, 6 of the component 3 and the mounting surface 4 in tight contact with each other, so that both electrical bonding areas 5, 6 are melted and ultrasonically bonded together, and thereby the component 3 is mounted on the mounting surface 4.

18 Claims, 12 Drawing Sheets

METHOD AND APPARATUS FOR MOUNTING COMPONENT

This is a divisional application of U.S. Ser. No. 09/373,957 field on Aug. 13, 1999 now U.S. Pat. 6,193,136.

BACKGROUND OF THE INVENTION

1. Technical Field of the Invention

The present invention relates to component mounting method and apparatus wherein a component is mounted on a mounting surface by bonding their respective metallic electrical bonding interconnects. In particular, it describes the process of and apparatus for manufacturing an electronic circuit substrate wherein electronic components such as bare IC chips are mounted on substrates such as printed-wiring circuit boards.

2. Description of Prior Art

Bare IC chips are formed of a semiconductor wafer on which circuit patterns are fabricated using thin-film forming techniques and mounted on a printed board for manufacturing an electronic circuit board. As shown in FIG. 11, electrodes 107 are prefabricated in a circuit pattern on a bare IC chip 103 to be electrically connected to conductor lands 109 formed on a printed-wiring board 104. For mounting such bare IC chip 103 on the circuit board 104, a surface mount method is used wherein the bonding face 103a of the IC chip 103 where the electrodes 7 exist and the bonding face 104a of the circuit board 104 where the conductor lands 109 exist are brought to a face-to-face contact and fixed to each other for achieving electrical connection between the conductor lands 109 and electrodes 107. Sealant 111 made of resin is then filled between the bonding faces 103a, 104a as shown in FIG. 12 for encapsulating the circuit pattern including the electrical bonding areas formed on the bonding face 103a of the IC chip 103.

In a mounting method which has been used in recent years, a bare IC chip 103, on which metal bumps 108 have been formed upon electrodes 107 as shown in FIG. 11 by a wire bonding process or the like, is held by suction with a suction nozzle 114 and is brought opposite to a circuit board 104 at a predetermined location, where the bumps 108 are pressed onto conductor lands 109 on the circuit board 104 for bonding them in electrical connection with each other. At the same time the bumps 108 and conductor lands 109 are fixed to each other with adhesive 112 that may be supplied in advance to bumps 108 or conductor lands 109 or with solder paste that assists electrical bonding of metal interconnects. The bare IC chip 103 is thus mounted on the circuit board 104. The circuit board 104 is then held in an inclined state as shown in FIG. 12, and sealant 111 is flowed between the bonding faces 103a, 104a of the IC chip 103 and circuit board 104 as shown in phantom lines in the figure with the use of a dispenser 115 or the like. Sealing is completed when the sealant 111 is filled between the IC chip 103 and circuit board 104 as shown in solid lines in FIG. 12.

In such method the equipment cost is high, since the process of mounting bare IC chips 103 on circuit boards 104 and the process of dispensing sealant 111 between the bonding faces 103, 104a of IC chip 103 and circuit board 104 differ substantially from each other in the handling of circuit boards and the design of operations, and are performed separately in different apparatuses. Moreover, the sealant 111 takes time to flow into between the bonding faces 103, 104a, wherefore the productivity is low. For example, in the case of mounting an IC chip 103 of 10mm×10mm size, the dispenser 115 is moved along the upper side of the IC chip from one end to another and returned so as to apply the sealant 111 to the entire area between the bonding faces 103a, 104a. The operation is finished only when the sealant has filled between IC chip 103 and circuit board 104 to the extent that a wetted portion 113 is formed around the IC chip 103 as shown in FIG. 12. In such method it takes about 10 seconds for the operation of mounting one IC chip 103. Furthermore, there is not much choice of sealing materials, i.e., the sealant 111 must have a viscosity in the range 2000 to 3000 cps, since it is poured into the very small gap of about 50 μm between the bonding faces 103a, 104a. Moreover, a sealant 111 having such viscosity needs to be heated at a relatively high temperature of from 40 to 60° C. to set, because of which the operation time is further increased. It is also undesirable in the interest of economy in energy since heat consumption is high.

In addition, there is a risk that fillers contained in the sealant 111 that is poured in between the bonding faces 103a, 104a may be distributed in stripes, causing a sealing failure. Also, since electrical connection between bumps 108 of IC chips 103 and conductor lands 109 of circuit boards 104 is accomplished only by mutual contact, a defective bond is sometimes formed, even though the electrical bonding areas on IC chips and circuit boards are fixed with each other with adhesive 112 and sealant 111. The yield of product is thereby decreased. The bumps 108 and lands 109 may be fixed with each other using solder paste, which will, however, result in consumption of more heat and time for heating solder paste and for letting it set.

SUMMARY OF THE INVENTION

An object of the present invention is to provide a method and an apparatus for mounting components in which electrical bonding of components on a mounting surface is achieved without failure in a short period of time with simple equipment and low heat consumption.

To accomplish the above object, the component mounting method according to the present invention comprises the steps of: supplying a sealant to one or both of the component and mounting surface; placing the component in proximity to the mounting surface; pressing an electrical bonding area of the component tightly to an electrical bonding area of the mounting surface, whereby the sealant is compressed and filled between the component and mounting surface in a required area; and generating friction between the electrical bonding areas of the component and the mounting surface in tight contact with each other by moving the component and mounting surface relative to each other, whereby both of the electrical bonding areas are melted and welded together.

By the above method, the sealant can be forcibly and instantaneously filled in a required area between the component and mounting surface without any additional operation or time. Therefore, the bonding of both electrical bonding areas and the filling of the sealant can be achieved with one operation in a short time. There are no viscosity restrictions on the sealant as in the case of the flowing method and a sealant of high viscosity can be used, wherefore the sealant can be set in a short time at a low temperature during the above operation. The component mounting can thus be accomplished with simple operation and apparatus in a short period of time with low heat consumption. Moreover, the electrical bonding areas are securely welded together by melting metal, whereby the formation of a defective bond is prevented and the yield is improved. The production cost can be accordingly reduced.

In particular, when pressure-welding the electrical bonding areas of the component and mounting surface by friction therebetween, the metal welding can be swiftly performed if ultrasonic vibration is applied to the component thereby ultrasonically bonding the electrical bonding areas.

The sealant is supplied in advance to at least one of the bonding faces of the component and mounting surface. Since it is provided in a mass, air is hardly mixed therein. Alternatively, the sealant may be coated using a dispenser, printed, or transferred at an appropriate time. Either way, the sealant can be fed simply and swiftly during or in association with the operations for handling the component or mounting surface.

By using a bump for at least one of the electrical bonding areas of the component and the mounting surface, the ultrasonic bonding of the local electrical bonding areas of the component and mounting surface can be achieved easily and securely with a sufficient amount of metal and without being interfered by other elements.

In order to achieve the above objects, the component mounting apparatus of the present invention comprises a component feeding section for feeding components to a predetermined location; a mounting surface handling device for handling and positioning a mounting surface at a predetermined location for component mounting and for transferring the mounting surface to other places; a component handling device having a component handling tool for picking up the component fed from the component feeding section, bringing a bonding face of the component into tight contact with a bonding face of the mounting surface, and pressing the component onto the mounting surface; an ultrasonic vibration device for applying ultrasonic vibration to the component held by the component handling tool through this tool; and a controller, wherein the controller performs controlling of the above sections and devices such that a metallic electrical bonding area of the component is located to face a metallic electrical bonding area of the mounting surface at the component mounting position, and both are tightly pressed to each other, so that a sealant that is supplied in advance to one of the bonding faces of the component and the mounting surface is compressed and filled between both bonding faces in a required area, and at the same time the ultrasonic vibration device is activated so as to ultrasonically bond the electrical bonding areas of the component and the mounting surface together. With the above apparatus, the above described method can be automatically implemented stably at a high speed by the control of the controller in accordance with a predetermined program.

By providing a sealant feeder for supplying the sealant to one of the bonding faces of the component and the mounting surface before the component and the mounting surface are located to face each other, the sealant feeder being activated by the controller, a single apparatus can automatically perform the component mounting operation including the process of supplying sealant to one of the component and mounting surface.

The application conditions of sealant fed by the sealant feeder may be varied by means of the controller in accordance with the type of component to be mounted. In this way the sealant can be applied in a suitable amount and in a favorable condition for various types of components that differ from each other in terms of the size of their bonding faces, and sealing conditions that may vary depending on the types of component can also be automatically varied. The type of component being mounted can be recognized by any of manually inputted component data, component data stored in mounting program data, and component data read from the component being fed or its support member.

By providing a detector for detecting the amount of sealant from the information obtained by recognizing images of the sealant filled between the component and mounting surface, the amount of sealant fed from the sealant feeder can be corrected by the controller in accordance with the detected amount of sealant. In this way, even if the amount of sealant in a predetermined condition increases or decreases for some unknown reasons, it can be corrected automatically so that favorable sealing is constantly achieved.

The mounting surface handling device feeds the mounting surface such that its bonding face is upwards for mounting operation, whereas the component feeding section feeds the component with its bonding face upwards where the electrical bonding area exists, and the component handling device comprises a flipping device which picks up the component from above and turns the component handling tool so that the bonding face of the component faces down, and a bonding device equipped with the ultrasonic vibration device, which picks up the component from above of which bonding face has been turned upside down and feeds the component for the ultrasonic bonding operation on the mounting surface at the component mounting position. Components that are fed with their active faces upwards such as bare IC chips can be mounted in order on a mounting surface that also faces upwards by such actions of the flipping device and bonding device cooperating with each other.

The sealant can be cured simply by being left, but if a heater for heating the sealant directly or indirectly is provided at least at the component mounting position, the setting of the sealant can be forcibly completed at the same time when the bonding of the component on the mounting surface is finished. Instead of heating by a heater, the sealant may also be cured using light such as ultraviolet.

While novel features of the invention are set forth in the preceding, the invention, both as to organization and content, can be further understood and appreciated, along with other objects and features thereof, from the following detailed description and examples when taken in conjunction with the attached drawings.

DESCRIPTION OF PREFERRED EMBODIMENTS

Preferred embodiments of a component mounting method and an apparatus of the present invention will be hereinafter described with reference to FIG. 1 through FIG. 10.

Figure 5:
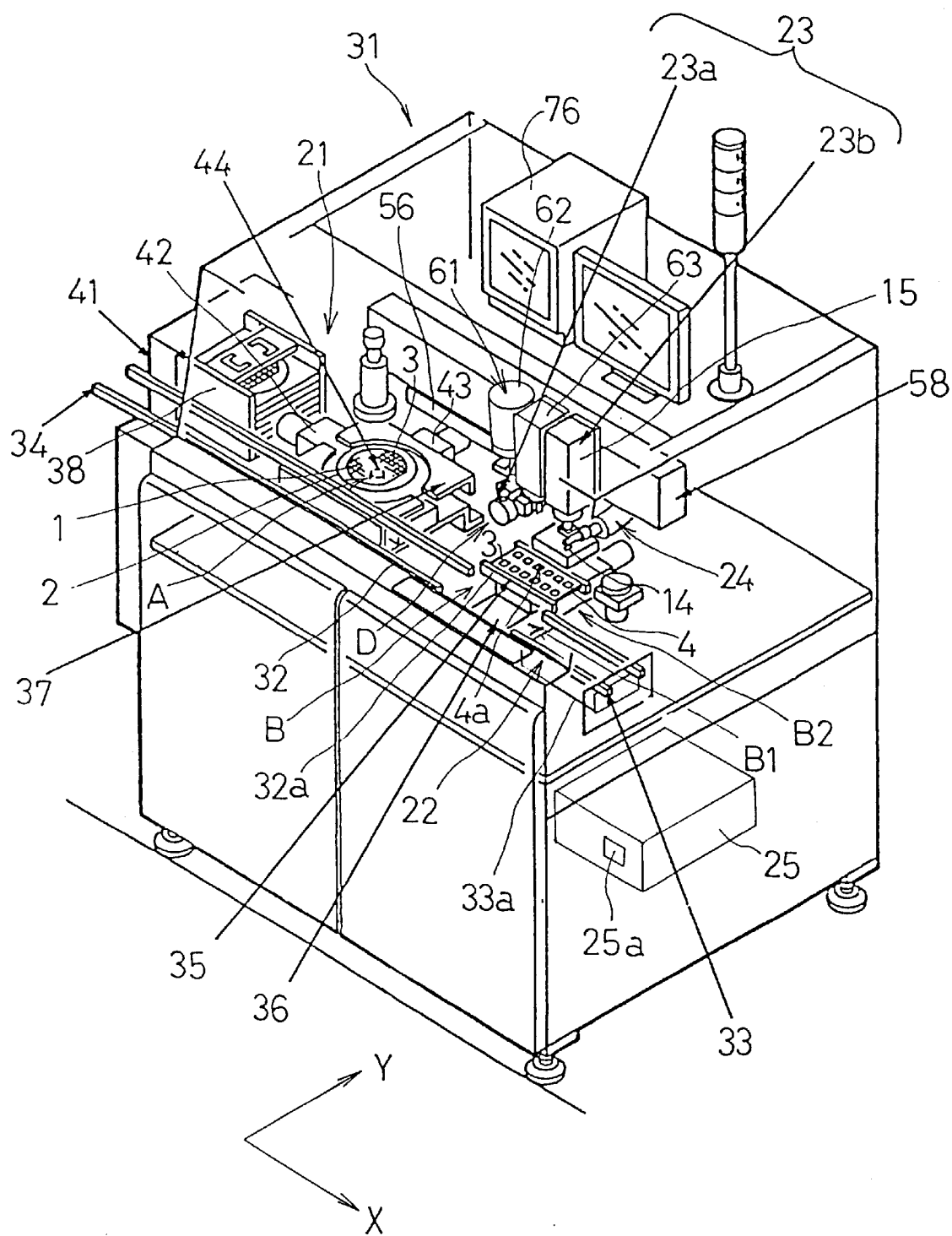
FIG. 5 is a perspective view schematically showing the overall construction of one embodiment of the component mounting apparatus of FIG. 1.
Figure 10:
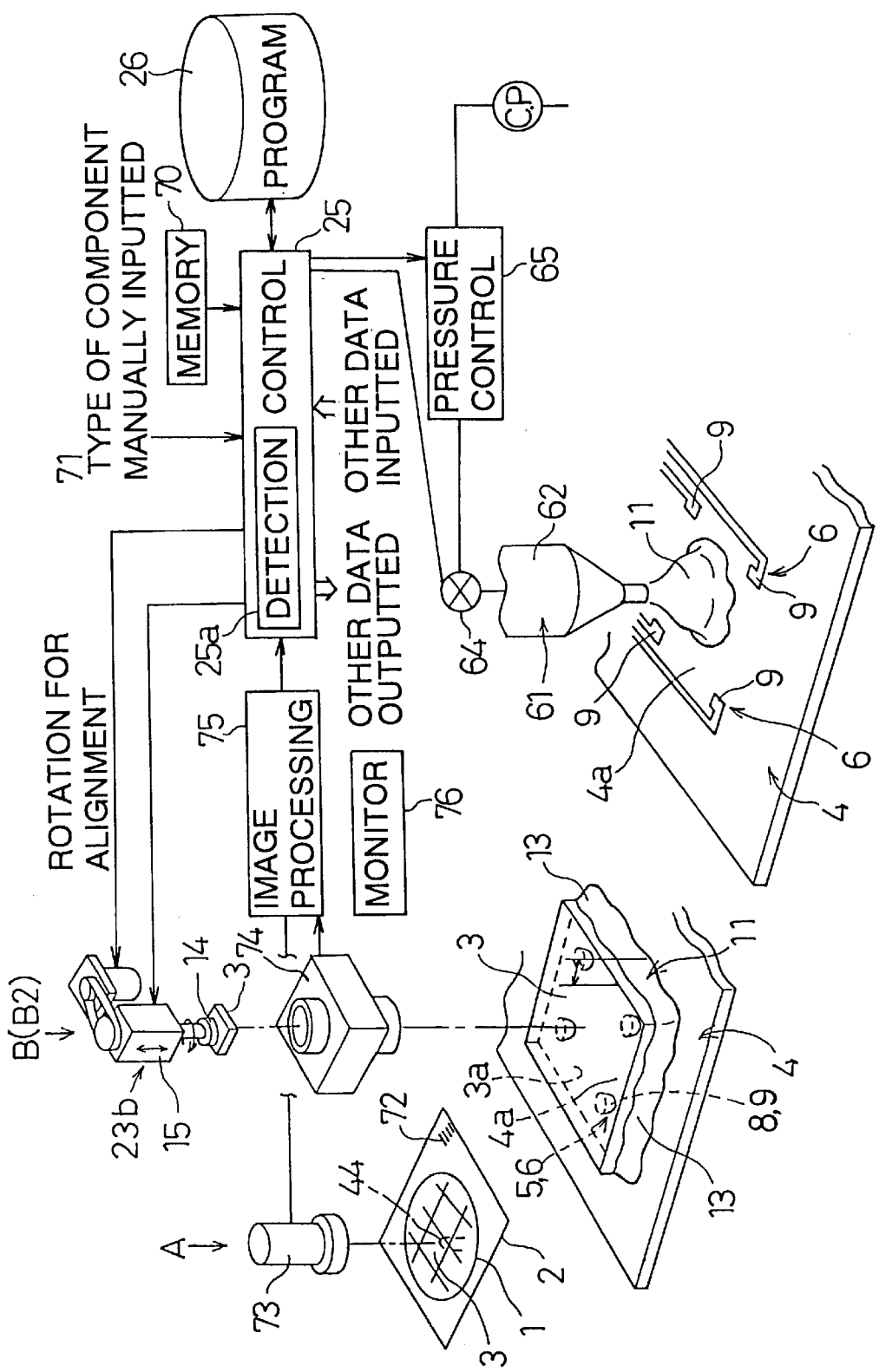
FIG. 10 is a block diagram showing the main control system of a controller in the apparatus of FIG. 5.
Figure 11:
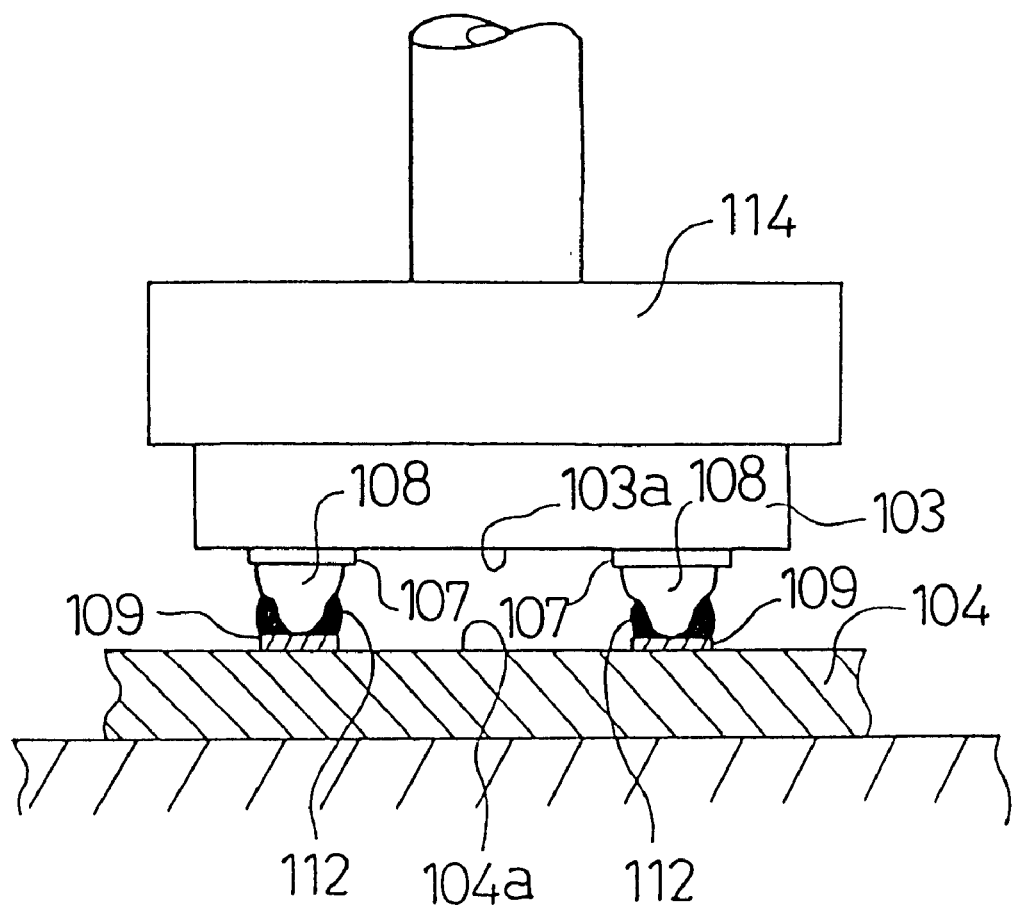
FIG. 11 is a cross-sectional view showing a state in a prior art component mounting method wherein a component is temporarily mounted on a board.
Figure 12:
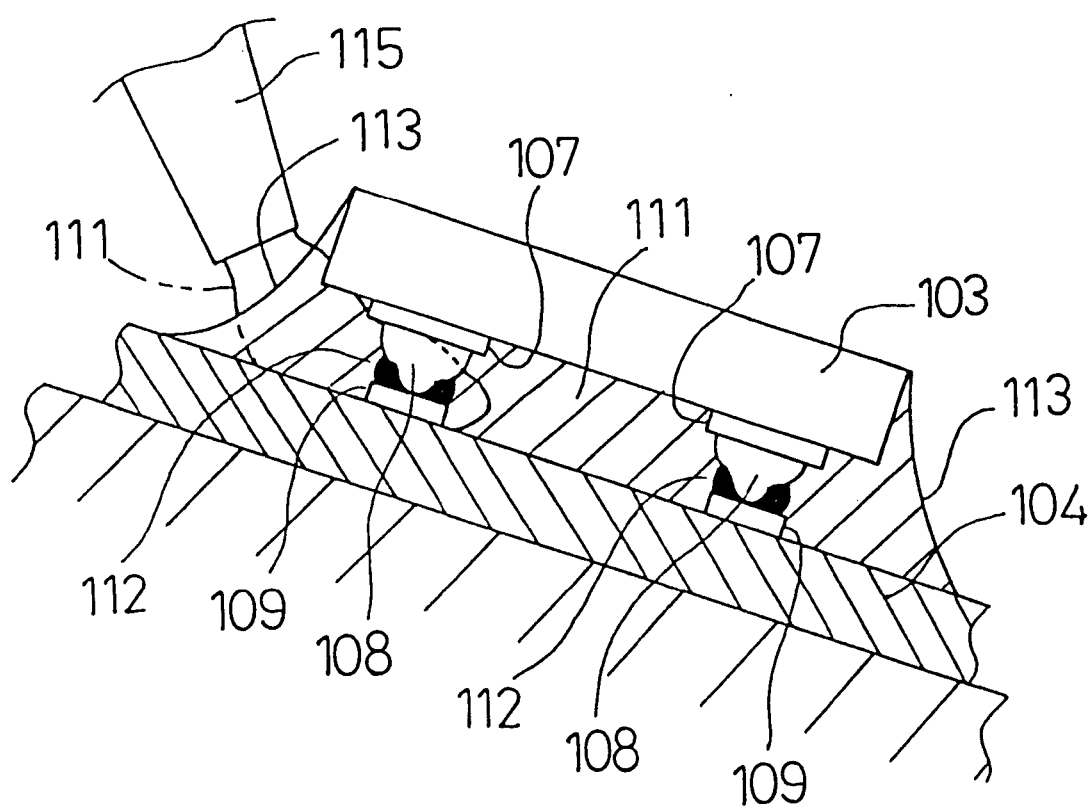
FIG. 12 is a cross-sectional view showing a state in a prior art component mounting method wherein the component which has been temporarily mounted on the board is sealed.

FIGS. 5 and 10 show an aspect of the embodiment whereby each bare IC chip 3 that is diced from a semiconductor wafer 1 on a dicing sheet 2 is handled as a component and mounted on a mounting surface or a circuit board 4, such as a printed-wiring board., and then the metal electrical bonding areas of the chip and the board are ultrasonically bonded by the friction created when ultrasound vibration is used to cause the chip and board to move in opposite directions against each other.

Figure 1:
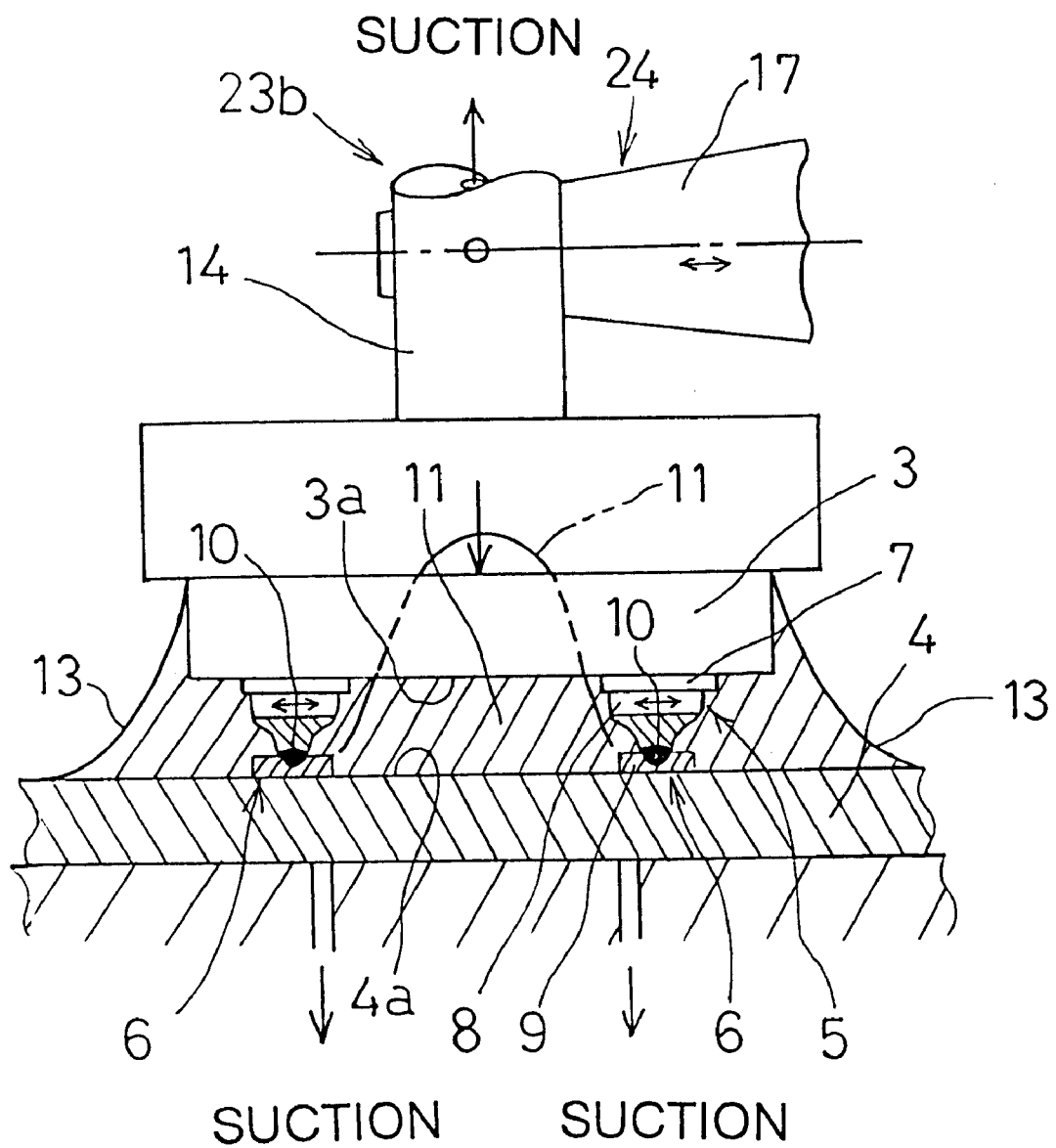
FIG. 1 is a cross-sectional view showing major parts in one embodiment of the mounting method and apparatus of the present invention.

FIG. 1 shows an embodiment where the electrical bonding area 5 of the IC chip 3 is formed as a metallic bump 8 provided by wire bonding technique on an electrode 7 fabricated by filmforming technique on a semiconductor wafer 1, and the electrical bonding area 6 of the circuit board 4 is formed as a conductor land 9 provided on its surface. It should be noted that the present invention is not limited to this arrangement but can also be applied to all additional cases where other electrical components and components other than electrical components for mounting on mounting surfaces other than circuit boards and in other arrangements; and to when conducting melting, bonding, and mounting by pressing two electrical bonding areas against each other and causing them to move opposite to each other using ultrasound vibration or another method.

In a component mounting method of the embodiment the bare IC chip 3 and the circuit board 4 are placed in proximity to each other and the bump 8 of the bare IC chip 3 is pressure welded to the conductor land 9 of the circuit board 4 such that a sealant 11 that was applied in advance to either the bump or land or to both is compressed between both while filling the space between them as shown in FIG. 1. The sealant 11 consists of silica and resin binder, etc., and is applied in advance to the top of the circuit board 4 as shown by the imaginary line in FIG. 1. Pressure welding the IC chip 3 and the circuit board 4 to each other causes the sealant 11 to spread an appropriate amount outward from around both bonding faces 3a and 4a within the limits possessed by a wetted area 13 as shown in FIGS. 1 and 10. At the same time ultrasonic vibration is applied to the bare IC chip 3 with the bump 8 of the bare IC chip 3 pressed against the conductor land 9 of the circuit board 4 as described above to cause friction in the direction of the arrow shown in the figure to melt the bump 8 and the land 9 to create ultrasonic fusion. As a result, the welded bonding area 10 creates an electrical contact between the bare IC chip 3 and the circuit board 4.

Figure 8:
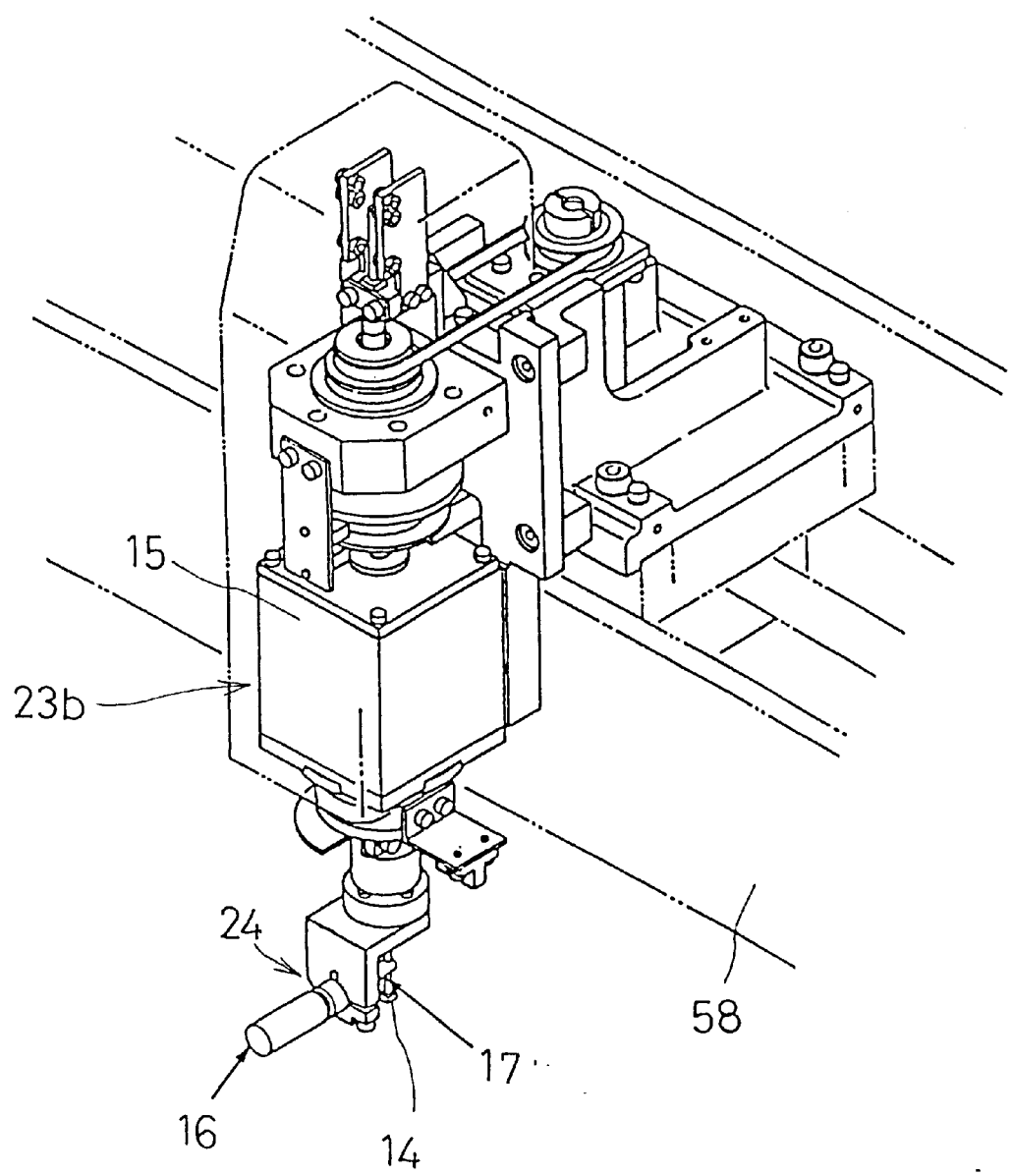
FIG. 8 is a perspective view showing a bonding device of the component handling device in the apparatus shown in FIG. 5.
Figure 9:
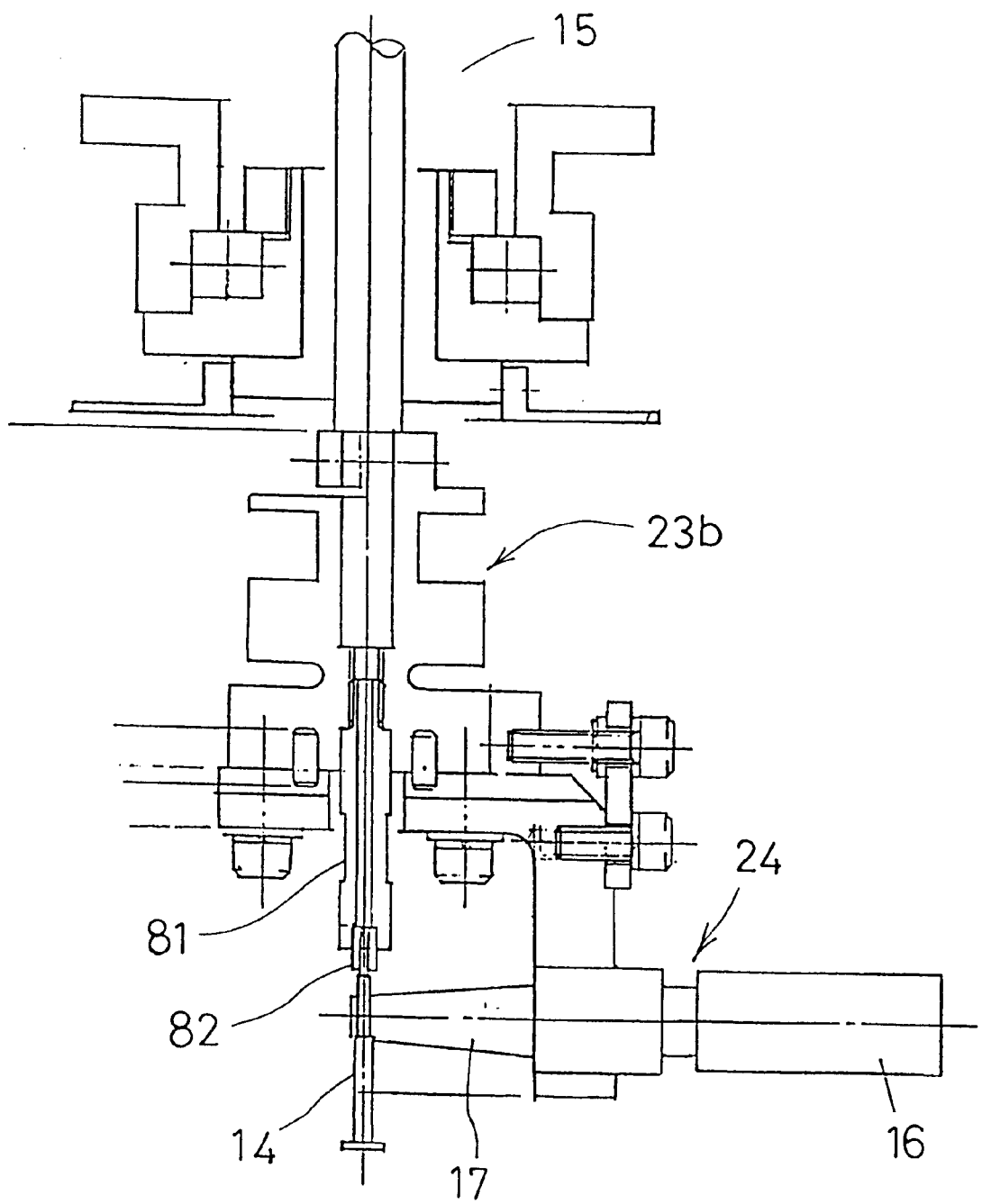
FIG. 9 is a cross section of the bonding device of FIG. 8.

When applying ultrasound while pressure welding the bump 8 of the bare IC chip 3 to the conductor land 9 of the circuit board 4, it is preferred that a suction nozzle 14, for example, be used as the automatic component handling tool for mounting the bare IC chip 3. The mounting apparatus of this embodiment employs a voice coil motor 15 as shown in FIG. 5 to raise and lower the suction nozzle 14 to apply an electromagnetic pressure of 500 g to 5 kg to effect the above-mentioned pressure welding. A horn 17 which receives the vibration from a piezoelectric element 16 is connected to the suction nozzle 14 as shown in FIG. 8, and to the suction nozzle 14 is applied an ultrasonic vibration with a frequency of 60 KHz and an amplitude of 1 to 2 $\mu$m to cause friction between the above-mentioned bump 8 and conductor land 9 that are pressed together. Depending on the type of component, however, a variety of component handling tools, such as those that use a chuck, adhesion, or screws to hold the components, can be used as long as an ultrasonic vibration is applied to the component being handled through the component handling tool. To prevent the suction nozzle 14 from being broken by the above-mentioned ultrasonic vibration, a support shaft 81 is connected through the agency of a flexible tube 82 to the horn 17 as shown in FIG. 9, and the suction from the support shaft 81 side also reaches the suction nozzle 14 via the flexible tube 82. But this has not been limited to a specific configuration, and a variety of designs are possible.

When the bond that results from the melting caused by the friction between the electrical bonding areas 5 and 6 is effected by the above-mentioned application of ultrasonic vibration to at least one of the component or mounting surface the required time is shortened by in units of $\frac{1}{10}$ sec. The present invention is not limited to this method and it is also possible to melt and bond the electrical bonding areas 5 and 6 from the friction created by simply moving the component and mounting surface in opposite directions to each other.

In this manner, when the bump 8 of the bare IC chip 3 and the conductor land 9 of the circuit board 4 are pressed against each other, the electrical bonding areas 5 and 6 of the bare IC chip 3 and circuit board 4, respectively, are melted to create an electrical connection through ultrasonic bond while at the same time the sealant 11 that is applied in advance to at least one of the bonding faces 3a and 4a of the bare IC chip 3 and circuit board 4, respectively, is compressed by the contact between both bonding faces 3a and 4a and forced to instantaneously fill the required area. Therefore, special work or time is not required to apply the sealant 11, so the electrical contact between the bump 8 and the conductor land 9 and the filling of the sealant 11 in the required area can be done in a short time during one operation and with just one apparatus.

In addition, there are no viscosity restrictions on the sealant 11 that is used as there are when using the flowing method. For example, a wide viscosity range of 2,000 to 10,000 cps can be set, so highly viscous substances can be used to achieve hardening in a short period of time while the abovementioned work is conducted at a low temperature of 25° C. for example. The types of the sealant 11 include epoxy compounds, acrylic compounds, and polyimide compounds. In this embodiment the sealant 11 is composed of a filler such as silicone, and a binder consisting of an adhesive obtained by mixing an acid anhydride or phenyl compound as a resin hardener to the above mentioned resin. The sealant 11 is not limited to these, however, for a variety of substances that will be developed hereafter can be used.

In accordance with the present invention, mounting of a component to a mounting surface can be conducted with one simple operation and a single apparatus in a short time with little heat consumption. Because the electrical bonding areas 5,6 such as the bump 8 and the conductor land 9 are fused by melting metal together, they make good interconnections, so defects from poor contacts are eliminated and yield is improved. The product cost is accordingly reduced. Incidentally, the time required to mount the 10 mm×10 mm bare IC chip 3 on the circuit board 4 using ultrasonic bonding together with a sealing processing was shortened to about 0.4 sec.

Figure 2:
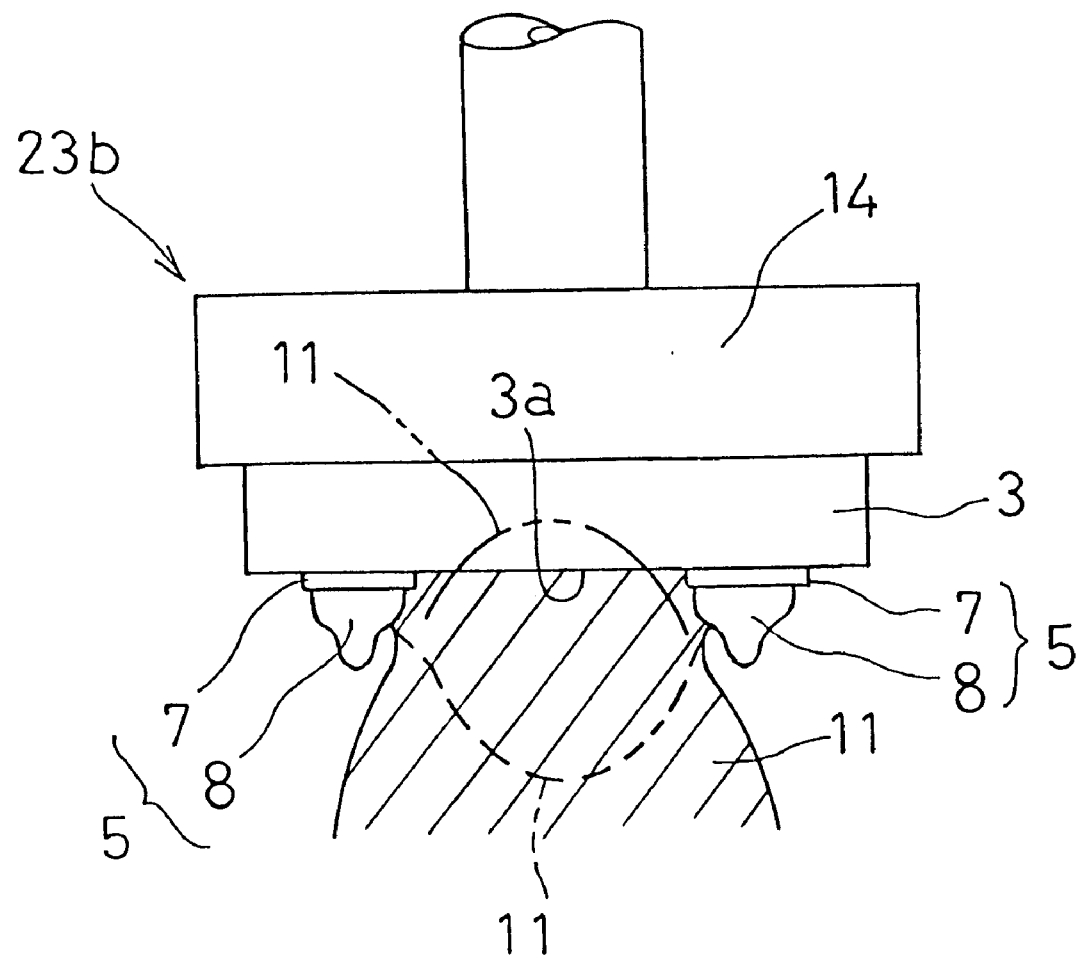
FIG. 2 is a diagram given in explanation of one example of how to apply a sealing material on the bonding face of a component.
Figure 3:
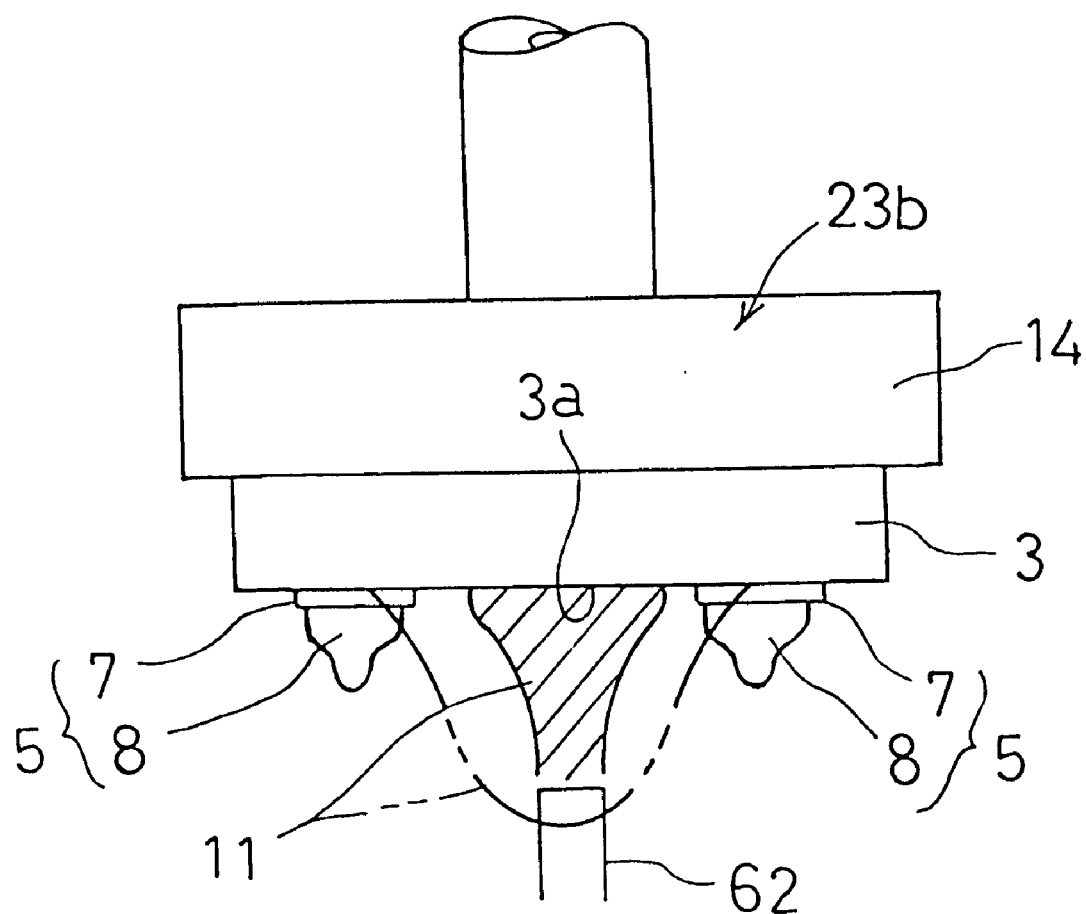
FIG. 3 is a diagram given in explanation of another example of how to apply a sealing material on the bonding face of a component.
Figure 4:
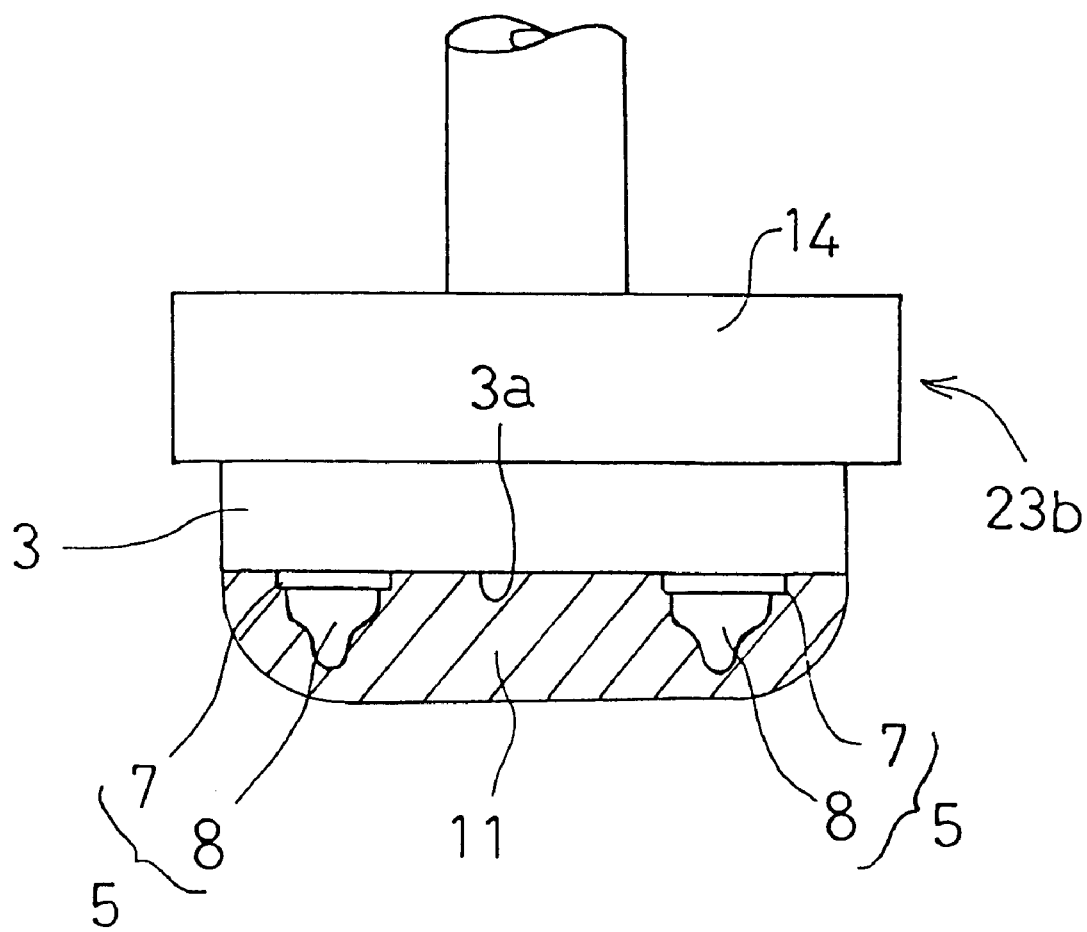
FIG. 4 is a diagram given in explanation of yet another example of how to apply a sealing material on the bonding face of a component.

The sealant 11 is supplied to either or both of the bonding faces 3a, 4a of the bare IC chip 3 and circuit board 4 in a mass as shown in phantom lines in FIG. 1 and in broken lines in FIG. 2. In this way, no air is mixed into the sealant. The sealant 11 may be coated using a dispenser 62 from below or above as respectively shown in FIG. 3 and 10, or may be provided by a printing or transferring process. Especially when depositing sealant 11 on a surface facing downwards, printing or transferring should preferably be used since there will be no dripping of the sealant. Alternatively, the sealant 11 can be applied to the bonding face 3a of the bare IC chip 3 held by the suction nozzle 14 by contacting the IC chip 3 to a heap of sealant 11 as shown in FIG. 2.

These operations can be performed simply in a short period of time utilizing a time lag between operations for handling bare IC chips 3 or circuit boards. Alternatively, it may be performed as one of preparatory processes associated with the handling of bare IC chips 3 or circuit boards 4 depending on cases.

A bump may be formed on conductor land 9 on circuit board 4 in place of or in addition to bump 8 on electrode 7 of chip 3 as shown in FIG. 1 and FIG. 2. Provision of such bump on at least one of electrical bonding areas of chip 3 and circuit board 4 enables local ultrasonic bonding to be performed securely with a sufficient amount of metal and without being interfered or damaged by other parts.

The component mounting apparatus of this embodiment shown in FIG. 5 comprises a component feeding section 21 where components such as bare IC chips 3 are fed to a predetermined position A, a mounting surface handling device 22 by which a mounting surface such as circuit board 4 is fed to a component mounting position B and transferred to a next step after chips have been mounted thereon, a component handling device 23 having the component handling tool or the suction nozzle 14 for bringing a component to a position opposite to circuit board 4 so that the bonding face 3a of IC chip 3 where electrical bonding areas 5 or bumps 8 exist and the bonding face 4a of circuit board 4 where electrical bonding areas 6 or conductor lands 9 exist face each other and their electrical bonding areas 5,6 are pressure-welded, an ultrasonic vibration device 24 for applying ultrasonic vibration to the component through the component handling tool such as suction nozzle 14, and a controller 25. The controller 25 controls the above sections and devices such that at the component mounting position B, the bare IC chip 3 handled by the component handling device 23 is brought to a face-to-face contact with the circuit board 4 handled by the mounting surface handling device 24 and pressed thereto so as to compress the sealant 11 that is provided in advance to either one of the bonding faces 3a, 4a and to fill same in a required area, and at the same time the ultrasonic vibration device 24 is activated for ultrasonic bonding electrical bonding areas such as bumps 8 and conductor lands 9 with each other. The above process can be automatically performed stably at a high speed by means of the controller 25 which execute control in accordance with predetermined program data as shown in FIG. 10.

Preferably but not limited, microcomputers may be used for the controller 25. Various other construction and modes for controlling operations of the apparatus may be employed. Program data 26 may be stored in a memory inside the controller 25 or in an outer memory, or may take any other form or structure such as a hardware circuitry for performing sequence control.

Figure 6:
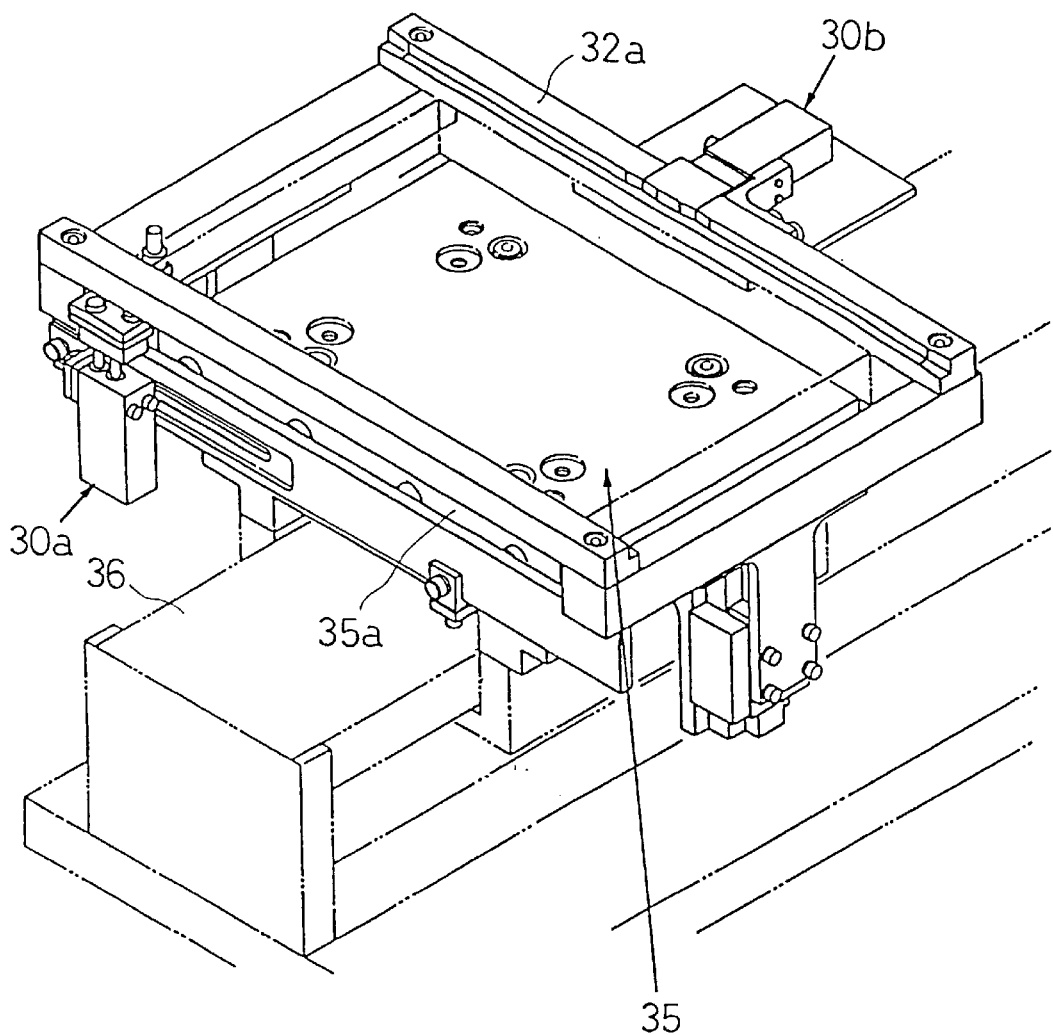
FIG. 6 is a perspective view showing a bonding stage disposed at a component mounting position in the apparatus shown in FIG. 5.

In the example shown in FIG. 5, the mounting surface handling device 22 is disposed in the front part of a base body 31, where the circuit board 4 is handled such that its bonding face 4a is upwards, so that IC chips can be readily mounted thereon from above. The mounting surface handling device 22 comprises a loader 33 at one end of rails 32 and an unloader 34 at the other end thereby constituting a transfer mechanism for transporting a circuit board 4 in a direction X. The mounting surface handling device 22 may be constructed such as to transport the circuit board by other types of carrier in accordance with the size and shape of mounting surface. The rails 32 include an independent portion 32a immediately downstream of loader 33 as shown in FIG. 5 and FIG. 6, which is the area defined as the component mounting position B. Behind the rails 32 a bonding stage 35 is provided that holds the rail 32a together with a circuit board 4 received on the rail 32a by suction from below. The rail 32a and the bonding stage 35 are supported on a Y-direction table 36 and thereby moved in a direction Y orthogonal to the aforementioned direction X between a delivery position B1 where the rail 32a is aligned in single file with the rails 32 and an operating position B2 therebehind where the component mounting is performed.

When a circuit board 4 carried in from loader 33 arrives at the component mounting position B on rail 32a, it is received on bonding stage 35 at a predetermined location defined by a stopper 30a shown in FIG. 6, and is positioned by a locator 30b which presses circuit board 4 towards one side of rail 32a. After being located, the circuit board 4 is held by suction on bonding stage 35. Meanwhile, bonding stage 35 itself is moved and located at the operating position B2 thereby feeding circuit board 4 for mounting operation. After component installing is completed at operating position B2, bonding stage 35 moves to the delivery position BI and releases circuit board 4 for allowing it to be fed downstream and transferred to unloader 34 where it is discharged for a next step. Thus a multiplicity of circuit boards 4 are successively fed for mounting operation and electronic circuit boards can be continuously manufactured.

Loader 33 and bonding stage 35 respectively have a preliminary heater 33a and main heater 35a as shown in FIG. 5 and FIG. 6. Circuit board 4 is first heated at preliminary heater 33a and then heated at main heater 35a so that a sealant 11 filled between circuit board 4 and bare IC chip 3 is heated to a temperature of about 25° C. Because of such low temperature heating the sealant 11 can be cured during chips 3 are ultrasonically bonded on a circuit board 4. Preliminary heating may be omitted but should preferably be performed for smooth heating. Light such as ultraviolet may also be used for setting sealant 11.

Component feeding section 21 is disposed behind rails 32. downstream of component mounting position B and comprises a component magazine 38 in which bare IC chips 3 diced from a semiconductor wafer 1 on a dicing sheet 2 are stocked. Component magazine 38 is moved upward and downward by a magazine lifter 41. Magazine lifter 41 determines the height of component magazine 38 such that a dicing sheet 2 carrying thereon a desired type of chips 3 is positioned opposite to a discharge means (not shown). Dicing sheet 2 pushed or pulled out is held and spread on an expand stage 37 so that the IC chips 3 are distanced from each other and readily picked up.

Expand stage 37 is moved in X and Y directions by tables 42, 43 respectively so that the chip 3 on dicing sheet 2 which is to be picked up is located at a component feeding position A where chips are thrust upwards by a push-up pin 44. When the feeding of IC chips 3 is completed or the types of IC chips 3 need to be changed, the dicing sheet 2 on expand stage 37 is accordingly exchanged with another. Thus various kinds of IC chips 3 are successively and automatically fed and mounted as required. It should be noted that the component feeding section 21 may be arranged variously according to the types and feeding modes of components to be mounted, and may be disposed in combination with various other types of component feeders.

Figure 7:
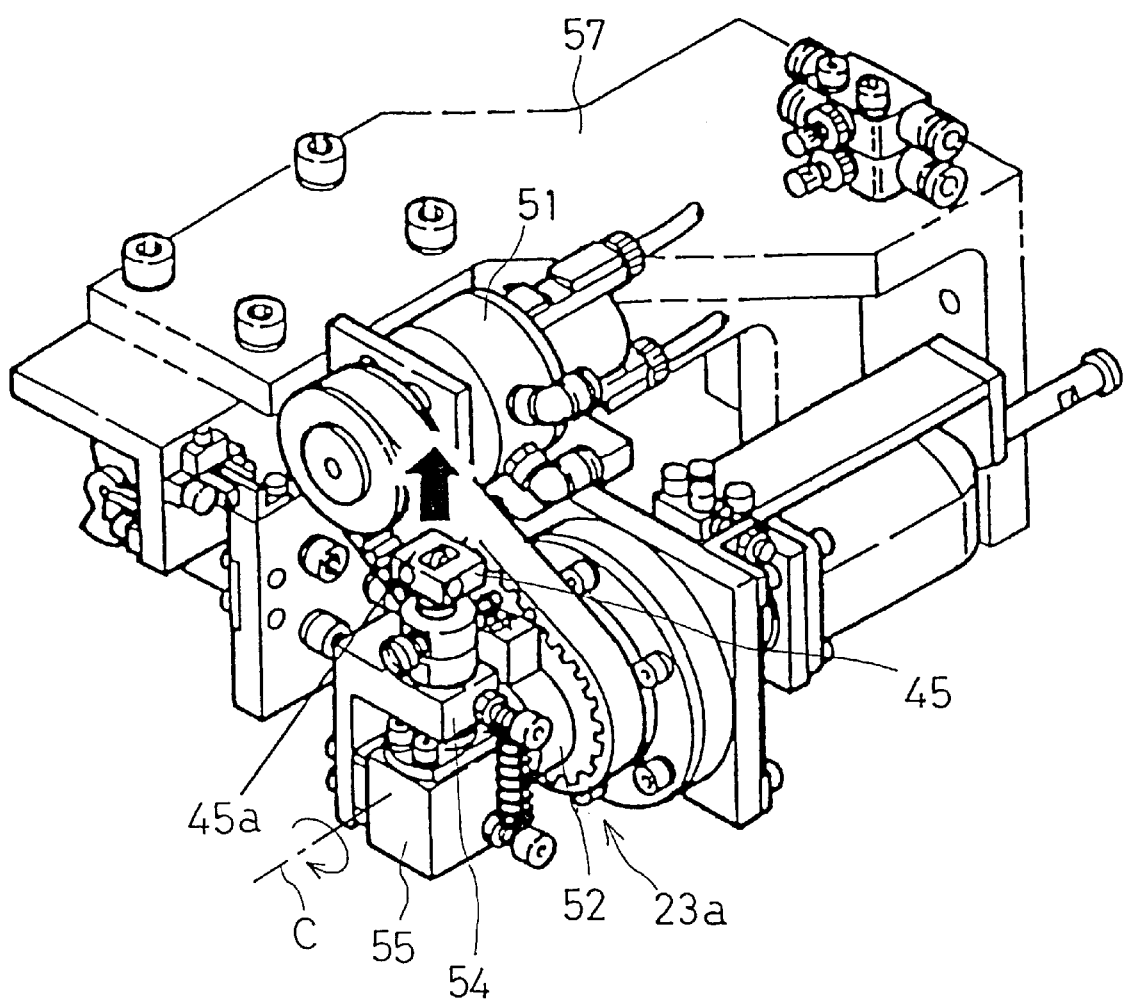
FIG. 7 is a perspective view showing a flipping device of the component handling device in the apparatus shown in FIG. 5.

Since the circuit board 4 is fed with its bonding face 4a upwards while the component feeding section 21 supplies IC chips 3 with their bonding faces upwards in this embodiment, the component handling device 23 comprises a flipping device 23a and a bonding device 23b as shown in FIG. 5 and FIG. 7. Flipping device 23a picks up a component with a component handling tool such as a suction nozzle 45 from above and turns over the component upside down. More specifically, flipping device 23a turns the component handling tool around a point on its suction face 45a or a point C somewhat off from the suction face 45a so as to turn over the component 3. Bonding device 23b equipped with ultrasonic vibration device 24 as shown in FIG. 8 and FIG. 9 then picks up the component 3 and feeds it for ultrasonic bonding on circuit board 4 at the component mounting position B.

IC chips 3 may be fed on a dicing sheet 2 spread on expand stage 37, whether used alone or in combination with other parts feeders which supply components in a different form. When mounting these components in a great number in succession, IC chips 3 on the dicing sheet 2 are first picked up and turned over by the flipping device 23a. The bonding device 23b then picks up the component from above-and presses it to the bonding face 4a of the circuit board 4 at the component mounting position B for ultrasonically bonding bumps 8 and conductor lands 9. The flipping device 23a and bonding device 23b cooperate with each other in mounting chips 3 fed with their faces upwards on a circuit board 4 continuously as described above.

Referring to FIG. 5 and FIG. 7, flipping device 23a comprises a base 57, a motor 51, a shaft 52 driven to rotate by motor 51, and a flipping head 54 equipped with one or a plurality of component handling tools or suction nozzles 45 as in this embodiment mounted around shaft 52. Base 57 is moved by a table 56 in a direction X between the component feeding position A where the flipping device 23a picks up chips 3 and the delivery position D where it delivers the inverted chip to the bonding device 23b. Suction nozzle 45 is advanced and retracted on flipping head 54 in an axial direction by means of an air cylinder 55.

Suction nozzle 45 is faced downward and moved up and down at component feeding position A for picking up chips 3, and then is turned around the point C mentioned before to be upwards for turning over the chip 3 before feeding it to the bonding device 23b at delivery position D.

Bonding device 23b having the suction nozzle 14 is moved between delivery position D and mounting position B by a table 58 in direction X, whereby bonding device 23b performs ultrasonic bonding operation repeatedly such that it picks up a bare IC chip 3 with its bonding face 3a down at delivery position D, and moves to the operating position B2 for pressure welding the IC chip at a predetermined position on a circuit board 4 located in a certain position. In this way bare IC chips that are fed from the component feeding section 21 with their bonding faces 3a upwards can be mounted on circuit boards 4 as required by the flipping device 23a and bonding device 23b cooperating with each other. The -construction may be arranged. such that the flipping device 23a is set stationary at component feeding position A whereas the bonding device 23b is capable of moving between feeding position A and mounting position B, or conversely, the flipping device 23a may be moved from feeding position A to mounting position B while the bonding device 23b stays at mounting position B.

The combination of movements of bonding device 23b in the direction X and movements of bonding stage 35 in the direction Y enables a chip 3 to be mounted at any location on circuit board 4. The construction should not be limited to this example and may be variously arranged.

Both flipping device 23a and bonding device 23b are not necessarily be moved linearly but in various other forms including non-linear movements, and various components including IC chips may take any movement paths.

The apparatus of this embodiment shown in FIG. 5 further has a sealant feeder 61 for supplying sealant 11. Controller 25 controls the mounting surface handling device 22, component handling device 23, and sealant feeder 61 such that the sealant 11 is applied to at least one of bonding faces 3a, 4a of IC chip 3 and circuit board 4 before they are located to face each other. In this way, a single apparatus automatically performs both of the process of providing sealant 11 to at least one of the IC chip 3 and circuit board 4, and the process of mounting IC chips on circuit boards 4.

Sealant feeder 61 may be, for example, disposed such as to be moved in the direction X together with bonding device 23b by the table 58 as shown in FIG. 5. By way of example, sealant feeder 61 in this embodiment operates such that when it is moved to component mounting position B, it lowers a dispenser 62 by means of a cylinder 63 for feeding sealant 11 on the bonding face 4a of circuit board 4 as shown in phantom lines in FIG. 1. After the feeding is completed, dispenser 62 is lifted and sealant feeder 61 is retreated sidewards. At the same time the bonding device 23b moves to component mounting position B and presses the IC chip 3 down upon the sealant 11 on circuit board 4 with the suction nozzle 14.

The application conditions of sealant 11 fed by the sealant feeder 61 can be varied by means of the controller 25 in accordance with the type of component to be mounted. Therefore, sealant 11 can be applied in a suitable amount and in a favorable condition for each of various types of components that differ from each other in terms of the size of their bonding faces. Sealing conditions that may vary depending on the type of component can also be automatically varied. Air is blown into the dispenser 62 so as to compress and discharge sealant 11 in a fixed amount. As shown in FIG. 10, the amount of dispensed sealant 11 can be adjusted by controlling a solenoid valve 64 for air supply and a pressure adjusting valve 65. It is also possible to provide several different types of sealant feeders 61 and to change the modes of application of sealant by selectively using a suitable sealant feeder according to the purposes. For example, there may be set two modes; in one mode the sealant is provided in a mass and in another mode the sealant is coated to the entire surface of the bonding face. Alternatively, the construction may be such that the surface to which sealant 11 is provided is switched over from one of the bonding faces 3a, 4a to another or to both of them.

The type of component being mounted can be recognized by any of component data 71 that are inputted manually, program data 26 for controlling mounting operation, component data stored in an inner or outer memory 70, and component data read from marks indicative of type of component such as a bar code 72 provided to the component being fed from the component feeding section or a support member of components such as dicing sheet 2 or tray (not shown). A recognition camera 73 is provided at the component feeding position A for recognizing the type of component from its image. Another recognition camera 74 is provided at the operating position B2 of the component mounting position B such as to be operable both upwards and downwards for recognizing the attitude of the component held by the suction nozzle 14 for chip alignment and the condition of the bonding face of the circuit board 4 from the picked-up images. The above mentioned data concerning the type of component can be read using these recognition cameras 73, 74. The image of component data taken by the cameras can then be recognized using an image processing circuit 75 provided for processing image data of images picked up by recognition cameras 73, 74. Therefore, no additional device for image recognition of component data is necessary.

Controller 25 has a detector 25*a* as its inner function for detecting the amount of sealant 11 after a bare IC chip has been mounted on a circuit board 4 based on the information obtained by picking up images of the sealant 11 filled between the IC chip 3 and circuit board 4 by the recognition camera 74, and by recognizing the presence and size of the wetted portion 13 by the image processing circuit 75 from these images. Controller 25 then corrects the amount of sealant 11 fed by sealant feeder 61 correspondingly to the detected amount of sealant. In this way, even if the amount of sealant 11 in a predetermined condition increases or decreases for some unknown reasons, the amount of sealant can be corrected automatically so that favorite sealing is constantly achieved. Furthermore a monitor 76 is connected to the image processing circuit 75 so that an operator can monitor the above described image recognition process.

Although the present invention has been fully described in connection with the preferred embodiment thereof, it is to be noted that various changes and modifications apparent to those skilled in the art are to be understood as included within the scope of the present invention as defined by the appended claims unless they depart therefrom.

What is claimed is:

1. A component mounting apparatus comprising:
    a component feeding section for feeding components to a predetermined location;
    a mounting surface handling device for handling and positioning a mounting surface at a predetermined location for component mounting and for transferring the mounting surface to other places;
    a component handling device having a component handling tool for picking up the component fed from the component feeding section, bringing a bonding face of the component into tight contact with a bonding face of the mounting surface, and pressing the component onto the mounting surface;
    an ultrasonic vibration device for applying ultrasonic vibration to the component held by the component handling tool through this tool;
    a controller,
    wherein the controller performs controlling of said sections and devices such that a metallic electrical bonding area of the component is located to face a metallic electrical bonding area of the mounting surface at the component mounting position, and both are tightly pressed to each other, so that a sealant that is supplied in advance to one of the bonding faces of the component and the mounting surface is compressed and filled between both bonding faces in a required area, and at the same time the ultrasonic vibration device is activated so as to ultrasonically bond the electrical bonding areas of the component and the mounting surface together; and a sealant feeder for supplying the sealant to one of the bonding faces of the component and the mounting surface before the component and the mounting surface are located to face each other, the sealant feeder being activated by the controller.

2. The component mounting apparatus according to claim 1 wherein the controller changes application conditions of the sealant fed by the sealant feeder in accordance with the type of component to be mounted.

3. The component mounting apparatus according to claim 2 further comprises a detector for detecting the amount of sealant from the information obtained by recognizing images of the sealant being filled between the component and the mounting surface, wherein the controller corrects the amount of sealant fed by the sealant feeder.

4. The component mounting apparatus according to claim 1 wherein a heater for heating the sealant directly or indirectly thereby to set the sealant is provided at least at the component mounting position.

5. A component mounting apparatus comprising:
    a component feeding section for feeding components to a predetermined location;
    a mounting surface handling device for positioning a mounting surface at a predetermined location for component mounting;
    a component handling device having a component handling tool for picking up a component fed from the component feeding section, bringing a bonding face of the component into contact with a bonding face of the mounting surface, and pressing the component onto the mounting surface;
    a friction welding device for applying a frictional welding force between the component and the mounting surface;
    a sealant feeder for applying a sealant to one of the bonding face and the mounting surface; and
    a controller for directing the component feeding section to feed a component to the predetermined location, the mounting surface handling device to position a mounting surface at the predetermined location, the sealant feeder to apply a sealant between the bonding faces of the mounting surfaces and the friction welding device to apply a frictional welding force to the bonding faces having the sealant thereon.

6. The component mounting apparatus of claim 5 further comprising means for providing a plurality of sealants and matching a specific sealant with a specific component automatically before applying the matched sealant.

7. The component mounting apparatus of claim 5, wherein the applied force is an ultrasound vibrating force.

8. The component mounting apparatus of claim 5 further including a heating device for heating the sealant to set the sealant simultaneously with welding of the component to the conductor.

9. A component mounting apparatus for electrically interconnecting and sealing an electronic component with at least one electrode onto a mounting surface with at least one conductor land comprising
    a sealant feeder for applying a sealant material to one or both of the component and mounting surface in a predetermined amount;

a welding device for applying a force to weld the electrode and the conductor land having the sealant material thereon to provide an electrical connection and a sealing of the electrical connection; and an imaging device for imaging the sealant material applied and a controller for comparing the sealant image with a predetermined image and adjusting the amount of sealant applied based on the comparison result.

10. The component mounting apparatus of claim 9, wherein the sealant material is applied to the electronic component adjacent the electrode and subsequently imaged before aligning with the mounting surface.

11. The component mounting apparatus of claim 9 further comprising means for providing a plurality of sealant materials and matching a specific sealant material with a specific electronic component automatically before applying the matched sealant.

12. The component mounting apparatus of claim 9, wherein the applied force is an ultrasound vibrating force.

13. The component mounting apparatus of claim 12, wherein the applied force is between 500 g and 5,000 g.

14. The component mounting apparatus of claim 9, wherein the sealant material has a viscosity range of 2,000 cps to 10,000 cps.

15. The component mounting apparatus of claim further including a heating device for heating the sealant material to set the sealant material simultaneously with welding of the electrode to the conductor.

16. A component mounting apparatus comprising:

a component feeding section for feeding components to a predetermined location;

a mounting surface handling device for handling and positioning a mounting surface at a predetermined location for component mounting and for transferring the mounting surface to other places;

a component handling device having a component handling tool for picking up the component fed from the component feeding section, bringing a bonding face of the component into contact with a bonding face of the mounting surface, and pressing the component onto the mounting surface;

an ultrasonic vibration device for applying ultrasonic vibration to the component held by the component handling tool through this tool;

a controller, wherein the controller performs controlling of said sections and devices such that a metallic electrical bonding area of the component is located to face a metallic electrical bonding area of the mounting surface at the component mounting position, and both are pressed to each other, so that a sealant that is supplied in advance to one of the bonding faces of the component and the mounting surface is compressed and filled between both bonding faces in a required area, and at the same time the ultrasonic vibration device is activated so as to ultrasonically bond the electrical bonding areas of the component and the mounting surface together, and wherein the mounting surface handling device feeds the mounting surface such that its bonding face is positioned upwards for a mounting operation, whereas the component feeding section feeds the component with its bonding face upwards where the electrical bonding area exists, and the component handling device comprises a flipping device which picks up the component from above and turns the component handling tool so that the bonding face of the component faces downward, and a bonding device equipped with the ultrasonic vibration device, which picks up the component from above of which bonding face has been turned upside down and feeds the component for the ultrasonic bonding operation on the mounting surface at the component mounting position.

17. The component mounting apparatus according to claim,16 wherein the component is a bare IC chip formed of a semiconductor wafer.

18. The component mounting apparatus according to claim 17 wherein the bare IC chip is diced from the semiconductor wafer on a dicing sheet, and the component feeding section comprises an expand stage for expanding the dicing sheet at a predetermined position for allowing the components thereon to be fed.

* * * * *